United States Patent
Bruekers et al.

(10) Patent No.: US 6,269,338 B1
(45) Date of Patent: Jul. 31, 2001

(54) DATA COMPRESSION AND EXPANSION OF AN AUDIO SIGNAL

(75) Inventors: Alphons A. M. L. Bruekers; Arnoldus W. J. Oomen; Renatus J. Van Der Vleuten, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 08/937,435

(22) Filed: Sep. 25, 1997

(30) Foreign Application Priority Data

Oct. 10, 1996 (EP) ................................ 96202807
Jul. 11, 1997 (EP) ................................ 97202137

(51) Int. Cl.$^7$ ............................ H04B 1/66; G10L 19/04; H03M 3/02; H03M 7/32

(52) U.S. Cl. ......................... 704/500; 704/219; 341/51; 341/65; 341/143

(58) Field of Search ........................... 704/500, 501, 704/502, 503, 504, 219; 341/51, 65, 143

(56) References Cited

U.S. PATENT DOCUMENTS

| | | | |
|---|---|---|---|
| 4,229,820 | * 10/1980 | Enomoto | 375/245 |
| 5,014,284 | * 5/1991 | Langer et al. | 341/65 |
| 5,023,611 | * 6/1991 | Chamzas et al. | 341/51 |
| 5,038,202 | * 8/1991 | Ooishi et al. | 348/396 |
| 5,276,764 | * 1/1994 | Dent | 704/200 |
| 5,533,012 | * 7/1996 | Fukasawa et al. | 704/500 |
| 5,742,930 | * 4/1998 | Howitt | 704/500 |
| 5,854,810 | * 12/1998 | Denissen et al. | 375/242 |

FOREIGN PATENT DOCUMENTS

| | | |
|---|---|---|
| 0402973A1 | 12/1990 | (EP) . |
| 2288043A | 10/1995 | (GB) . |
| 52288A | 1/1993 | (JP) . |

OTHER PUBLICATIONS

Lerch et al., "A Monolithic Sigma–Delta A/D and D/A Converter with Filter for Broad–Band Speech Coding," IEEE Journal of Solid–State Circuits, vol. 26, No. 12, Dec. 1991, pp. 1920 to 1927, Dec. 1991.*

Lars Risbo, "Improved Stability and Performance from Sigma–Delta Modulators using 1–bit Vector Quantization," 1993 IEEE International Symposium on Circuits and Systems, May 1993, pp. 1365 to 1368.*

Kershaw et al., "Sigma–delta modulator for audio DSP," IEE Colloquium on Audio DSP—Circuits and Systems, pp. 1/1 to 1/6, Dec. 1993.*

Yu et al., "Adaptive quantisation for one–bit sigma–delta modulation," IEE Proceedings–G Circuits, Devices and Systems, Feb. 1992, vol. 139, pp. 39 to 44.*

Zourntos et al., "Stable One–Bit Delta–Sigma Modulators Based on Switching Control," Proceedings of the 1998 IEEE International Conference on Acoustics, Speech and Signal Processing, May 1998, vol. 3, pp. 1597 to 1600.*

"A Digital Decimating Filter for Analog–to–Digital Conversion of Hi–Fi Audio Signals", By J.J. Van Der Kam in Philips Techn. Rev. 42, No. 6/7, Apr. 1986, pp. 230–238.

(List continued on next page.)

*Primary Examiner*—David R. Hudspeth
*Assistant Examiner*—Martin Lerner
(74) *Attorney, Agent, or Firm*—Michael E. Belk

(57) ABSTRACT

An apparatus for data compressing an analog audio signal includes an input terminal for receiving the audio signal and a 1-bit A/D converter for A/D converting the audio signal to a digital bitstream signal. The apparatus has a lossless coder for lossless data compression of the bitstream signal to a data compressed bitstream signal, and has an output terminal for supplying the data compressed bitstream signal. A recording apparatus and a transmitter apparatus use the data compression apparatus. An apparatus for expanding the data compressed bitstream signal to a replica of the analog audio signal is used by a reproducing apparatus and a receiver apparatus.

35 Claims, 3 Drawing Sheets

OTHER PUBLICATIONS

"A Higher Order Topology for Interpolative Modulators for Oversampling A/D Converters", by Kirk C.H. Chao Et Al in IEEE Trans. on Circuits and Systems, vol. 37, No. 3, Mar. 1990, pp. 309–318.

"A Method for the Construction of Minimum–Redundancy Codes", by D.A. Huffman in Proc. of the IRE, vol. 40(10) Sep. 1952.

"An Introduction to Arithmetic Coding", by G.G. Langdon, IBM, J. Res. Develop., vol. 28(2) Mar. 1984.

"A Universal Algorithm for Sequential Data Compression", by J. Ziv Et Al, IEEE Trans. on Inform. Theory, vol. IT–23, 1977.

* cited by examiner

US 6,269,338 B1

DATA COMPRESSION AND EXPANSION OF AN AUDIO SIGNAL

FIELD OF THE INVENTION

The invention relates to the field of data compression and most closely relates to real time compression of a digitally sampled audio data stream.

BACKGROUND OF THE INVENTION

The invention relates to a data compression apparatus for data compressing an audio signal, to a data compression method, a transmitter including the data compression apparatus, a recording apparatus including the data compression apparatus, a record carrier having the data compressed audio signal recorded on it in a track of the record carrier, to a data expansion apparatus for data expanding a data compressed audio signal, to a data expansion method, a receiver including the data expansion apparatus and to a reproducing apparatus including the data expansion apparatus.

Data compression on an audio signal is well known in the art. Reference is made in this respect to EP-A 402,973, document D1 herein list of related documents. The document describes a subband coder, in which an audio signal is A/D converted with a specific sampling frequency, such as 44.1 kHz, and the resulting samples in the form of eg. 24 bits wide words of the audio signal, are supplied to a subband splitter filter. The subband splitter filter splits the wideband digital audio signal into a plurality of relatively narrow band subband signals. Using a psycho acoustic model, a masked threshold is derived and blocks of samples of the subband signals are subsequently quantised with a specific number of bits per sample for each block of the subband signals, in response to the masked threshold, resulting in a significant data compression of the audio signal to be transmitted. The data compression carried out is based on 'throwing away' those components in the audio signal that are inaudible and is thus a lossy compression method. The data compression described in document D1 is a rather intelligent data compression method and requires a substantial number of gates or instructions, when embodiment either in hardware or software respectively, so that it is expensive. Moreover, the subsequent expansion apparatus also requires a substantial number of gates or instructions, when implemented in hardware or software respectively.

Those skilled in the art are hereby referred to the following listed documents:

(D2) "A digital decimating filter for analog-to-digital conversion of hi-fi audio signals", by J. J. van der Kam in Philips Tech. Rev. 42, no. 6/7, April. 1986, pp. 230–8

(D3) "A higher order topology for interpolative modulators for oversampling A/D converters", by Kirk C. H. Chao et al in IEEE Trans. on Circuits and Systems, Vol. 37, no. 3, March. 1990, pp. 309–18

(D4) "A method for the construction of minimum-redundancy codes", by D. A. Huffman in Proc. of the IRE, Vol. 40(10), September 1952.

(D5) "An introduction to arithmetic coding" by G. G. Langdon, IBM J. Res. Develop., Vol. 28(2), March 1984.

(D6) "A universal algorithm for sequential data compression" by J. Ziv et al, IEEE Trans. on Inform. Theory, Vol. IT-23, 1977.

The above citations and tho sin the list of related documents below are hereby incorporated in whole by reference.

SUMMARY OF THE INVENTION

The invention aims at providing a data compression apparatus for data compressing an audio signal such that it is more simple and that the corresponding expander apparatus can also be more simple and less expensive.

The data compression apparatus in accordance with the invention comprises input apparatus for receiving the audio signal, conversion apparatus for carrying out a conversion on the audio signal so as to obtain a 1-bit bitstream signal, the conversion apparatus comprising sigma-delta modulator apparatus, lossless coding apparatus for carrying out a substantially lossless data compression step on the bitstream signal so as to obtain a data compressed bitstream signal, and output apparatus for supplying the data compressed bitstream signal. More specifically, when the audio signal is an analog audio signal, the conversion apparatus is in the form of A/D conversion apparatus for carrying out a 1-bit A/D conversion on the analog audio signal so as to obtain the bitstream signal.

The invention is based on the following recognition. The audio signal can be applied in analog form or in digital form. When A/D converting, in accordance with the invention, an analog audio signal with a 1-bit A/D converter (also named: bitstream converter or sigma-delta modulator), the audio signal to be A/D converted is sampled with a frequency which is generally a multiplicity of the frequency of 44.1 kHz or 48 kHz. The output signal of the 1-bit A/D converter is a binary signal, named bitstream signal. When the audio signal is supplied in digital form, sampled at eg. 44.1 kHz, the samples being expressed in eg. 16 bits per sample, this digital audio signal is oversampled with a frequency which is again a multiplicity of this sampling frequency of 44.1 kHz (or 48 kHz), which results in the 1-bit bitstream signal.

Converting an audio signal into a 1-bit bitstream signal has a number of advantages. Bitstream conversion is a high quality encoding method, with the possibility of a high quality decoding or a low quality decoding with the further advantage of a simpler decoding circuit. Reference is made in this respect to the publications 'A digital decimating filter for analog-to-digital conversion of hi-fi audio signals', by J. J. van der Kam, document D2, and 'A higher order topology for interpolative modulators for oversampling A/D converters', by Kirk C. H. Chao et al, document D3.

1-bit D/A converters are used in CD players, as an example, to reconvert the bitstream audio signal into an analog audio signal. The audio signal recorded on a CD disk is however not a data compressed 1-bit bitstream signal.

It is well known in the art that the resulting bitstream signal of the 1-bit A/D converter is, roughly the, a random signal which has a 'noisy-like' frequency spectrum. Such types of signals are hard to data compress.

Surprisingly, however, it was established that using a lossless coder, such as a variable length coder in the form of a Huffman coder or an arithmetic coder, a significant data reduction could be obtained, in spite of the noisy character of the bitstream signal from the 1-bit A/D converter.

Those skilled in the art will understand the invention and additional objects and advantages of the invention by studying the description of preferred embodiments below with reference to the following drawings which illustrate the features of the appended claims.

BRIEF DESCRIPTION OF THE DRAWINGS

FIG. 6 shows the data expansion apparatus incorporated in a reproducing apparatus for reproducing the data compressed bitstream signal from a record carrier and.

DETAILED DESCRIPTION OF THE PREFERRED EMBODIMENT

Figure 1:
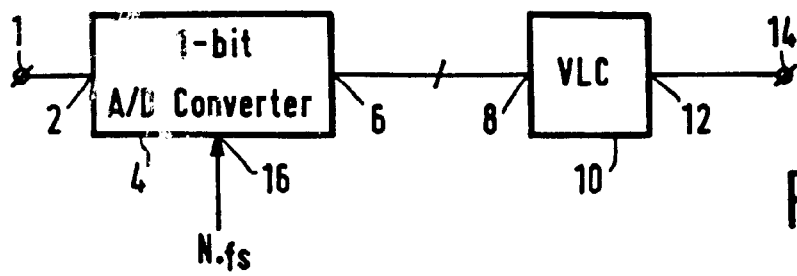
FIG. 1 shows an embodiment of the data compression apparatus.

FIG. 1 shows an embodiment of the data compression apparatus, including an input terminal 1 for receiving the audio signal. In the present example, the audio signal is an analog audio signal. The input terminal 1 is coupled to an input 2 of a 1-bit A/D converter 4, also called: sigma-delta modulator. An output 6 of the 1-bit A/D converter 4 is coupled to an input 8 of a data compression unit 10. An output 12 of the data compression unit 10 is coupled to an output terminal 14.

The 1-bit A/D converter 4 is adapted to carry out a 1-bit A/D conversion on the audio signal so as to obtain a bitstream signal which is supplied to the output 6. To that purpose, the A/D converter 4 receives a sampling frequency equal to $N.f_s$, via an input 16. $f_s$ is a frequency equal to eg. 32 kHz, 44.1 kHz or 48 kHz and N is a large number, such as 64. The audio signal is sampled in the A/D converter 4 with a sampling frequency of eg. 2.8224 MHz (64 * 44.1 kHz). The bitstream signal appearing at the output 6 of the A/D converter thus has a bitrate of 2.8224 MHz.

The data compression unit 10 is in the form of a lossless coder. Lossless coders have the advantage that they can data compress the audio signal in such a way that, after data expansion by a lossless decoder, the original audio signal can be reconstructed in a substantially lossless way. Thus, means that there is substantially no loss of information after compression-expansion. Lossless coders can be in the form of a variable length coder. Variable length coders are well known in the art. Examples of such variable length coders are Huffman coders, arithmetic coders and Lempel-Ziv coders. Reference is made in this respect to the publications 'A method for the construction of minimum-redundancy codes' by D. A. Huffman, document D4, 'An introduction to arithmetic coding' by G. G. Langdon, document D5, and 'A universal algorithm for sequential data compression' by J. Ziv et al, document D6.

The data compression unit 10 carries out a substantially lossless data compression step on the bitstream signal so as to obtain a data compressed bitstream signal at its output 12, which is supplied to the output terminal 14.

Figure 2A:
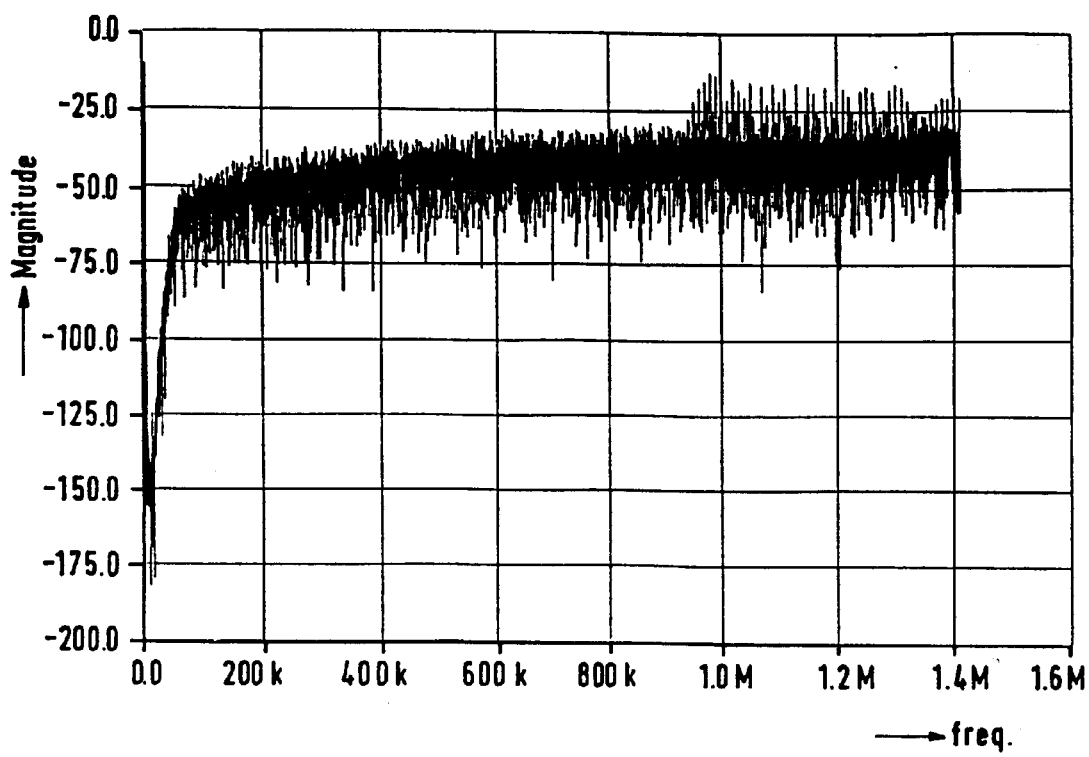
FIG. 2a shows the frequency spectrum of the output signal of the 1-bit A/D converter 4 in FIG. 1
Figure 2B:
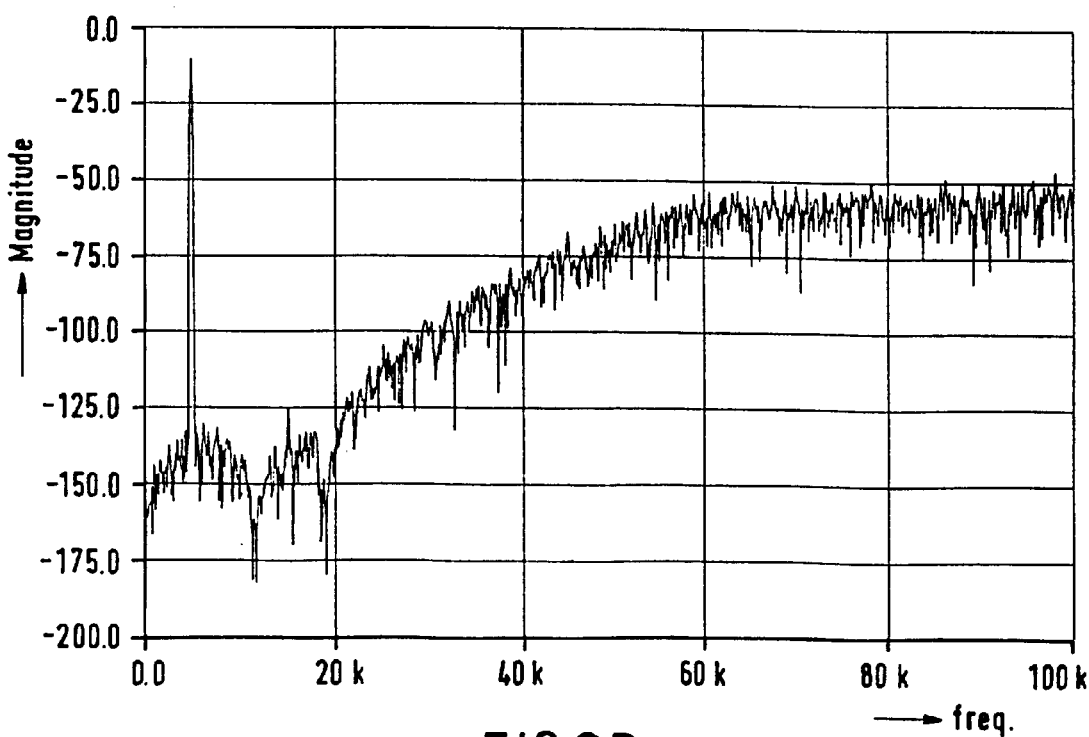
FIG. 2b shows the frequency spectrum of the same output signal in a smaller frequency range.

FIG. 2a shows a frequency spectrum of the bitstream signal present at the output 6 of the A/D converter 4, for an input signal in the form of a 5 kHz sinusoid, sampled with a sampling frequency of 2.8224 MHz. The spectrum thus shows frequencies between 0 Hz and 1.4 MHz. FIG. 2b shows part of the spectrum shown in FIG. 2a, namely that part between 0 Hz and 100 kHz, so as to more clearly show the 5 kHz sinusoid contained in the bitstream signal. Clearly visible is the noise-like character of the bitstream signal, especially in the higher frequency region, which seems to imply that carrying out data compression on the said signal will not result in a substantial amount of data reduction.

Contrary to this, investigations have made clear that a significant data reduction can be obtained. In the following table, the results of the data compression realized by three lossless coders are given for three different music fragments:

| fragment | Huffman (8 b) | Hufmann (16 b) | Lempel-Ziv |
|---|---|---|---|
| | | δ | |
| bossanova | 1.31 | 1.45 | 1.73 |
| jazz | 1.35 | 1.50 | 1.77 |
| classical music | 1.38 | 1.59 | 1.86 | where δ is the compression ratio, defined as the ratio of the bitrate of the input signal of the coder to the bitrate of the output signal of the coder.

Figure 3:
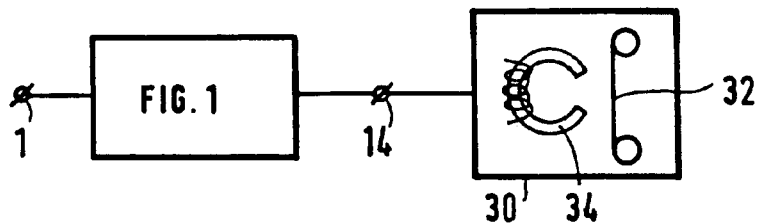
FIG. 3 shows the data compression apparatus incorporated in a recording apparatus for recording the data compressed bitstream signal on a record carrier.

FIG. 3 shows an embodiment of a recording apparatus including the data compression apparatus shown in FIG. 1. The recording apparatus further includes a write unit 30 for writing the data compressed bitstream signal in a track on the record carrier 32. In the present example, the record carrier 32 is a magnetic record carrier, so that the write unit 30 including at least one magnetic head 34 for writing the data compressed bitstream signal in the record carrier 32. The record carrier may however be an optical record carrier, such as a CD disk or a DVD disk.

Figure 4:
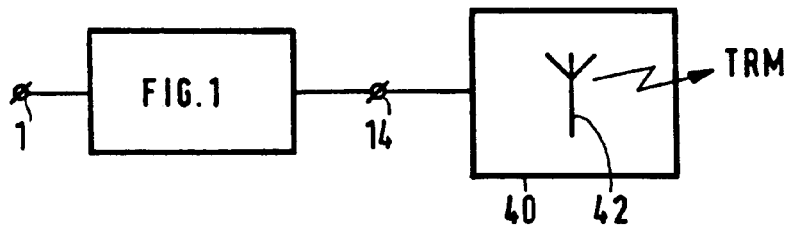
FIG. 4 shows the data compression apparatus incorporated in a transmission apparatus for transmitting the data compressed bitstream signal via a transmission medium.

FIG. 4 shows an embodiment of a transmitter for transmitting an audio signal via a transmission medium TRM, including the data compression apparatus as shown in FIG. 1. The transmitter further includes a transmission unit 40 for applying the data compressed bitstream signal to the transmission medium TRM. The transmission unit 40 could includes an antenna 42.

Figure 8:
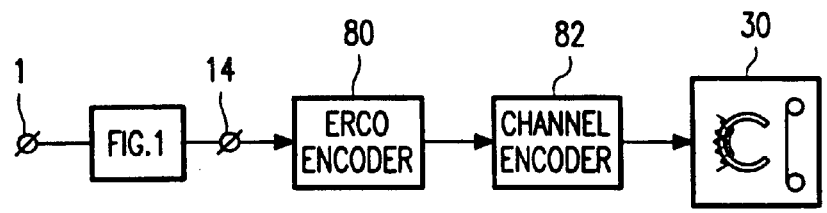
FIG. 8 shows a further embodiment of the recording apparatus further provided with an error correction encoder and a channel encoder.

Transmission via a transmission medium, such as a radio frequency link or a record carrier, generally requires an error correction encoding and a channel encoding carried out on the data compressed bitstream signal to be transmitted. FIG. 8 shows such signal processing steps carried out on the data compressed bitstream signal for the recording arrangement of FIG. 3. The recording arrangement of FIG. 8 therefore includes an error correction encoder 80, well known in the art, and a channel encoder 82, also well known in the art.

Figure 5:
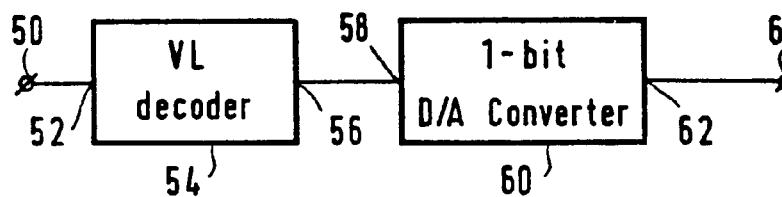
FIG. 5 shows an embodiment of the data expansion apparatus.

FIG. 5 shows an embodiment of the data expansion apparatus. The apparatus has an input terminal 50 for receiving the data compressed audio signal which is in the form of the data compressed bitstream signal, as supplied by the data compression apparatus of FIG. 1. The input terminal 50 is coupled to an input 52 of a data expansion unit 54, which has an output 56 which is coupled to an input 58 of a 1-bit D/A converter 60. An output 62 of the converter 60 is coupled to an output terminal 64.

The data expansion unit 54 is a lossless decoder, such as a variable length decoder in the form of eg. a Huffman decoder or an arithmetic decoder. It will be clear that the decoder in the data expansion apparatus of FIG. 5 should be the inverse of the encoder used in the data compression apparatus of FIG. 1, in order to realize a substantially lossless encoding-decoding step. The data expansion unit 54 expands the data compressed bitstream so as to obtain a replica of the original bitstream, which is supplied to the input 58 of the D/A converter 60. The converter 60 converts the bitstream into an analog audio signal which is supplied to the terminal 64.

Figure 6:
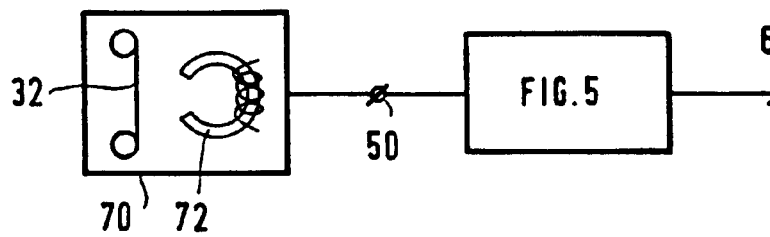

FIG. 6 shows the data expansion apparatus of FIG. 5 incorporated in a reproduction apparatus. The reproducing apparatus further includes a read unit 70 for reading the data compressed bitstream signal from a track on the record carrier 32. In the present example, the record carrier 32 is a magnetic record carrier, so that the read unit 70 includes at least one magnetic head 72 for reading the data compressed bitstream signal from the record carrier 32. The record carrier may however be an optical record carrier, such as a CD disk or a DVD disk.

Figure 7:
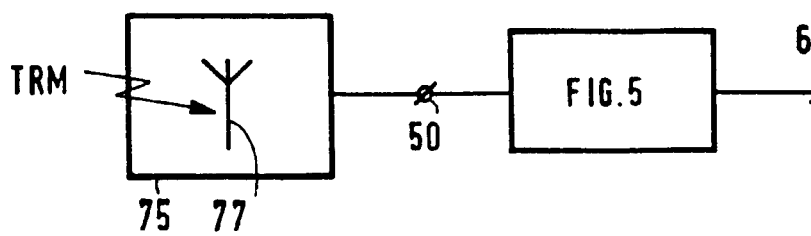
FIG. 7 shows the data expansion apparatus incorporated in a receiving apparatus for receiving the data compressed bitstream signal from a transmission medium.

FIG. 7 shows an embodiment of a receiver for receiving an audio signal via a transmission medium TRM, including the data expansion apparatus as shown in FIG. 5. The receiver further includes a receiving unit 75 for receiving the data compressed bitstream signal from the transmission medium TRM. The receiving unit 75 could includes an antenna 77.

Figure 9:
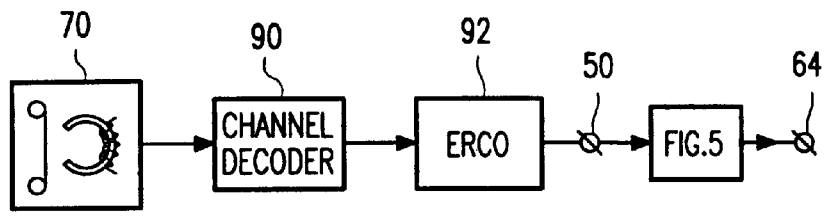
FIG. 9 shows a further embodiment of the reproducing apparatus further provided with a channel decoder and an error correction unit.

As has been explained above, transmission via a transmission medium, such as a radio frequency link or a record carrier, generally requires an error correction encoding and a channel encoding carried out on the data compressed bitstream signal to be transmitted, so that a corresponding channel decoding and error correction can be carried out upon reception. FIG. 9 shows the signal processing steps of channel decoding and error correction carried out on the received signal, received by the reading apparatus 70 for the reproducing arrangement of FIG. 6. The reproducing arrangement of FIG. 9 therefore include a channel decoder 90, well known in the art, and an error correction unit 92, also well known in the art, so as to obtain a replica of the data compressed bitstream signal.

Figure 10:
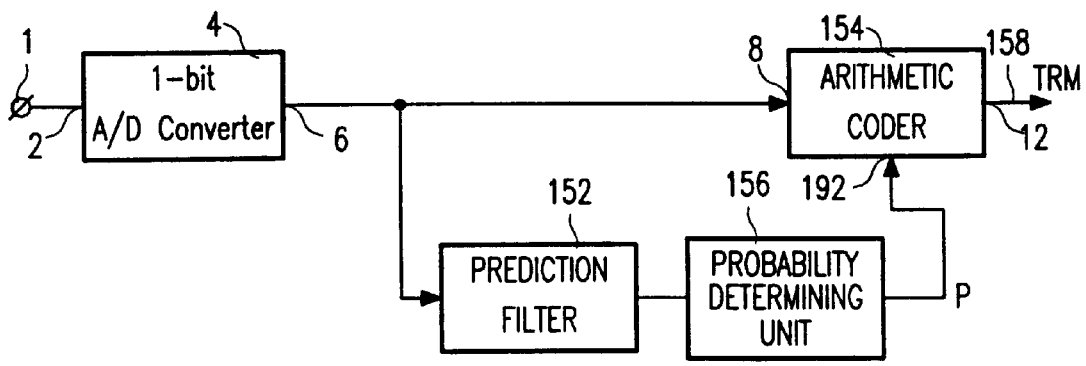
FIG. 10 shows an embodiment of the data compression apparatus in which the lossless coder is in the form of an arithmetic coder.

Another data compression apparatus is shown in FIG. 10. In the data compression apparatus of FIG. 10, the bitstream signal is supplied to an input 8 of a lossless coder, which is in the form of an entropy coder, such as an arithmetic coder 154. Further the bitstream signal is also an input of a prediction filter unit 152. An output of the prediction filter unit 152 is coupled to an input of a probability determining unit 156. The arithmetic coder 154 encodes the bitstream signal into a data compressed bitstream signal in response to probability values p supplied to its input 192. The probability determining unit 156 determines a probability value indicating the probability that a bit in the bitstream signal supplied by the converter unit 4 has a predetermined logical value, such as '1'. This probability value, denoted p in FIG. 10, is supplied to the arithmetic coder 154 so as to enable the data compression of the bitstream signal in the arithmetic coder 154. The determining unit 156 determines this probability value from the output signal of the prediction filter 152. The arithmetic coder 154 can data compress the bitstream signal on a frame-by-frame basis.

The functioning of the apparatus of FIG. 10 is as follows. The prediction filter 152 filters the bitstream signal so as to obtain a multi bit output signal. The multi bit output signal has a plurality of levels within a range of eg. +3 and −3. Further, for each of a plurality of subintervals in the value range of the multi bit output signal, it is determined what the probability is that the corresponding bit in the bitstream signal is eg. a '1' bit. This can be realized by counting the number of 'ones' and 'zeroes' occurring in the bitstream signal during a specific time interval, when the multi bit output signal falls in one of such ranges. The probabilities thus obtained for the various values in the multi bit output signal are subsequently supplied as the probability signal p to the arithmetic coder 154. The data compressed bitstream signal is supplied by the arithmetic coder 154 to an output line 158, for transmission via a transmission medium TRM or a record carrier.

Figure 11:
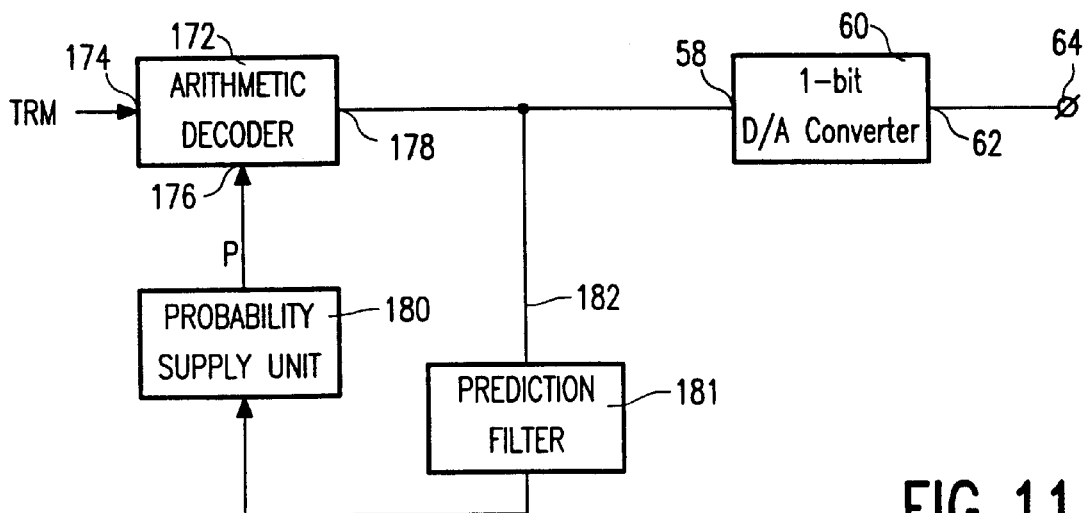
FIG. 11 shows an embodiment of the data expansion apparatus in which the lossless decoder is in the form of an arithmetic decoder.

FIG. 11 shows a corresponding data expansion apparatus for decoding the data compressed bitstream signal, received via the transmission medium TRM. The data processing apparatus of FIG. 11 includes an entropy decoder 172, which receives the data compressed bitstream signal via an input 174. In the present example, the entropy decoder 172 is in the form of an arithmetic decoder that carries out an arithmetic decoding step on the data compressed bitstream signal under the influence of a probability signal p, supplied to an input 176 so as to generate a replica of the original bitstream signal which is supplied to an output 178. The replica is supplied to an input 58 of the reconverter unit 60.

Further, a probability supply unit 180 is present for supplying the probability signal p to the arithmetic decoder 172. The probability signal p can be obtained in different ways, dependent on how the probability signal has been derived in the encoder. One way is, to derive the probability signal p in an adaptive way from the output signal of a prediction filter 181. In this embodiment, the prediction filter 181 is equivalent to the prediction filter 152 in the encoder and the probability supply unit 180 is equivalent to the probability determining unit 156 in the encoder of FIG. 10. Another way of generating the probability signal p, is by using side information received via the transmission medium TRM, as will be explained hereafter.

Side information can be generated by the apparatus of FIG. 10 for transmission to the apparatus of FIG. 11. Such side information can include the filter coefficients for the filter 152 that are determined on a frame by frame basis, which coefficients are transmitted to the corresponding prediction filter included in the unit 180.

Further, the apparatus of FIG. 10 can generate parameters that describe the conversion of the multi bit output signal of the prediction filter 152 into the probability signal p. Such parameters are also included in the side information and transmitted to the supply unit 180 and the filter 181, so as to enable the regeneration of the probability signal p in the apparatus of FIG. 11 on the basis of the multi bit output signal provided by the prediction filter 181.

The entropy encoder used in the embodiment of FIG. 10 is adapted to encode the bitstream signal using a probability signal in order to obtain the data compressed bitstream signal. One such entropy encoder is the arithmetic coder described above. One other type of such entropy coder is, as an example, the well known finite state coder. The entropy decoder used in the embodiment of FIG. 11 is adapted to decode the data compressed bitstream signal using a probability signal in order to obtain a replica of the bitstream signal. One such entropy decoder is the arithmetic decoder described above. One other type of such entropy decoder is, as an example, the well known finite state decoder.

Whilst the invention has been described with reference to preferred embodiments thereof, it is to be understood that these are not limitative examples. Thus, various modifications may become apparent to those skilled in the art, without departing from the scope of the invention, as defined by the claims. When the audio signal is supplied in digital form, such as sampled at 44.1 kHz and the samples being expressed in eg. 16 bits, the conversion apparatus are adapted to oversample the digital audio signal with eg. the frequency of (64 * 44.1 kHz ) so as to obtain the 1-bit bitstream signal.

It should further be noted that the invention also applies to an embodiment in which the bitstream signal, as supplied by the converter 4 has undergone an additional signal processing step resulting in a processed 1-bit bitstream signal that is supplied to the lossless coder 10. Such additional signal processing step could include merging a left and right hand signal component of a stereo audio signal, in 1-bit bitstream form, into a processed 1-bit bitstream signal.

Further, the invention lies in each and every novel feature or combination of features. The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

We claim:

1. An apparatus for data compressing an audio signal, comprising:
    input means for receiving the audio signal;
    conversion means for converting the audio signal into a 1-bit bitstream signal, the conversion means including sigma-delta modulator means;
    lossless coding means for substantially lossless data compression of the 1-bit bitstream signal into a data compressed bitstream signal; and
    output means for supplying the data compressed bitstream signal.

2. The data compression apparatus as claimed in claim 1, wherein the audio signal is an analog audio signal and the conversion means include A/D conversion means for 1-bit A/D converting the analog audio signal into the bitstream signal.

3. The data compression apparatus as claimed in claim 1, wherein the lossless coding means include a variable length coder.

4. The data compression apparatus as claimed in claim 3, wherein the variable length coder includes a Huffman coder.

5. The data compression apparatus as claimed in claim 3, wherein the variable length coder includes an arithmetic coder.

6. The data compression apparatus of claim 1 wherein the lossless coding means include:
    an entropy encoder for entropy encoding the bitstream signal in response to a probability signal, so as to obtain the data compressed bitstream signal;
    prediction means for prediction of the bitstream signal; and
    probability signal determining means for determining the probability signal from the prediction means.

7. The data compression apparatus as claimed in claim 6, wherein the prediction means include prediction filter means for prediction filtering of the bitstream signal to obtain a multi-value output signal, and wherein the probability signal determining means include means to derive the probability signal from the multi-value output signal.

8. An apparatus as claimed in claim 1, further comprising channel encoding means for channel encoding the data compressed bitstream signal prior to applying the data compressed bitstream signal to the output means.

9. A method for data compressing an audio signal, comprising the steps of:
    receiving the audio signal;
    converting the audio signal into a 1-bit bitstream signal, including a sigma-delta modulation step;
    substantially lossless data compressing the 1-bit bitstream signal into a data compressed bitstream signal; and
    supplying the data compressed bitstream signal.

10. The data compression method of claim 9, wherein the compression includes the substeps of:
    entropy encoding the bitstream signal in response to a probability signal, to obtain the data compressed bitstream signal;
    prediction of the bitstream signal; and
    determining the probability signal from the prediction.

11. The data compression method as claimed in claim 10, wherein the prediction includes the substep of prediction filtering the bitstream signal to obtain a multi-value output signal, and wherein probability determining includes the substep of deriving the probability signal from the multi-value output signal.

12. A method as claimed in claim 9, further comprising the step of channel encoding the data compressed bitstream signal prior to supplying the data compressed bitstream signal.

13. A transmitter for transmitting an audio signal via a transmission medium, comprising:
    input means for receiving the audio signal;
    conversion means for converting the audio signal into a 1-bit bitstream signal, the conversion means including sigma-delta modulator means;
    lossless coding means for substantially lossless data compression of the 1-bit bitstream signal into a data compressed bitstream signal; and
    transmission means for applying the data compressed bitstream signal to the transmission medium.

14. The transmitter as claimed in claim 13, further comprising channel encoding means, for channel encoding the data compressed bitstream signal prior to applying the data compressed bitstream signal to the transmission medium.

15. An apparatus for recording an audio signal on a record carrier, comprising:
    input means for receiving the audio signal;
    conversion means for converting the audio signal into a 1-bit bitstream signal, the conversion means including sigma-delta modulator means;
    lossless coding means for substantially lossless data compression of the 1-bit bitstream signal into a data compressed bitstream signal; and
    writing means for writing the data compressed bitstream signal in a track on the record carrier.

16. The recording apparatus as claimed in claim 5 wherein the record carrier includes optical or a magnetic record carrier apparatus.

17. The recording apparatus of claim 16, wherein the record carrier has a data compressed bitstream signal recorded on it in a track of the record carrier.

18. The recording apparatus as claimed in claim 15, further comprising channel encoding means for channel encoding the data compressed bitstream signal prior to writing the data compressed bitstream signal on the record carrier.

19. An apparatus for data expanding a data compressed audio signal so as to obtain a replica of an original audio signal, comprising:

input means for receiving the data compressed audio signal as a data compressed bitstream signal;

lossless decoding means for substantially lossless data expansion of the data compressed bitstream signal into a 1-bit bitstream signal;

Sigma-delta demodulator means for D/A converting the 1-bit bitstream signal into the replica of the original audio signals; and output means for supplying the replica of the original audio signal.

20. The data expansion apparatus as claimed in claim 19, wherein the lossless decoding means include a variable length decoder.

21. The data expansion apparatus as claimed in claim 20, wherein the variable length decoder includes a Huffman decoder.

22. The data expansion apparatus as claimed in claim 20, wherein the variable length decoder includes an arithmetic decoder.

23. The data expansion apparatus of claim 19 wherein the lossless decoding means include:

an entropy decoder for entropy decoding the data compressed bitstream signal in response to a probability signal so as to obtain the bitstream signal; and probability signal generator means for supplying the probability signal.

24. The data expansion apparatus as claimed in claim 23, wherein the entropy decoder includes an arithmetic decoder.

25. An apparatus as claimed in claim 19, wherein the data compressed bitstream signal received by the input means has been channel encoded and further comprising channel decoding means for channel decoding the received channel encoded data compressed bitstream signal prior to lossless data expansion of the data compressed bitstream signal by the lossless decoding mean.

26. A method for data expanding a data compressed audio signal so as to obtain a replica of an original audio signal, comprising the steps of:

receiving the data compressed audio signal as a data compressed bitstream signal;

substantially lossless data expansion of the data compressed bitstream signal into a 1-bit bitstream signal;

Sigma delta-demodulating the 1-bit bitstream signal into the replica of the original audio signal; and supplying the replica of the original audio signal.

27. The data expansion method of claim 26, wherein the lossless decoding step includes the substeps of:

entropy decoding the data compressed bitstream signal in response to a probability signal, to obtain the bitstream signal; and supplying said probability signal.

28. The data expansion method as claimed in claim 27, wherein the entropy decoding step includes an arithmetic decoding step.

29. A method as claimed in claim 26, wherein the received data compressed bitstream signal has been channel encoded and further comprising the step of channel decoding the received channel encoded data compressed bitstream signal prior to substantially lossless data expansion of the data compressed bitstream signal.

30. A receiver for receiving an audio signal via a transmission medium, comprising:

receiving means for retrieving the data compressed bitstream signal from the transmission medium;

lossless decoding means for substantially lossless data expansion of the data compressed bitstream signal into a 1-bit bitstream signal;

Sigma-delta demodulator means for D/A converting the 1-bit bitstream signal into the replica of the original audio signal; and output means for supplying the replica of the original audio signal.

31. The receiver as claimed in claim 30, wherein the receiver further comprises channel decoding means for channel decoding the signal retrieved from the transmission medium, to obtain the data compressed bitstream signal.

32. An apparatus for reproducing an audio signal from a record carrier, comprising:

reading means for reading a data compressed bitstream signal from a track on the record carrier;

lossless decoding means for substantially lossless data expansion of the data compressed bitstream signal into a 1-bit bitstream signal;

Sigma-delta demodulator means for D/A converting the 1-bit bitstream signal into the replica of the original audio signal; and output means for supplying the replica of the original audio signal.

33. The reproducing apparatus as claimed in claim 32, further comprising channel decoding means for channel decoding the signal read from the record carrier, to obtain the data compressed bitstream signal.

34. A record carrier with tracks including a recorded audio signal, produced by the process of:

receiving an audio signal;

Sigma-delta modulating the audio signal into a 1-bit bitstream signal;

substantially lossless data compressing the 1-bit bitstream signal into a data compressed bitstream signal; and writing the data compressed bitstream signal in a track of the record carrier.

35. A method as claimed in claim 34, wherein the data compressed bitstream signal is channel encoded prior to writing the data compressed bitstream signal in the track of the record carrier.

* * * * *